United States Patent [19]

Tanaka et al.

[11] 4,342,918
[45] * Aug. 3, 1982

[54] ION-NITRIDING APPARATUS

[75] Inventors: Akio Tanaka, Ono; Mizuo Edamura, Kobe; Satoshi Furuitsu, Kakogawa; Satoru Kunise, Akashi, all of Japan

[73] Assignee: Kawasaki Jukogyo Kabushiki Kaisha, Kobe, Japan

[*] Notice: The portion of the term of this patent subsequent to Dec. 18, 1996, has been disclaimed.

[21] Appl. No.: 181,844

[22] Filed: Aug. 27, 1980

Related U.S. Application Data

[60] Division of Ser. No. 4,613, Jan. 18, 1979, which is a continuation of Ser. No. 751,328, Dec. 16, 1976.

[30] Foreign Application Priority Data

| Dec. 29, 1975 | [JP] | Japan | 50-158107 |
| Jan. 14, 1976 | [JP] | Japan | 51-3471 |
| Feb. 16, 1976 | [JP] | Japan | 51-16379 |
| Mar. 1, 1976 | [JP] | Japan | 51-22382 |
| Mar. 1, 1976 | [JP] | Japan | 51-22383 |
| Mar. 19, 1976 | [JP] | Japan | 51-30381 |
| Jun. 1, 1976 | [JP] | Japan | 51-64370 |
| Jun. 1, 1976 | [JP] | Japan | 51-64371 |
| Jun. 1, 1976 | [JP] | Japan | 51-71326 |

[51] Int. Cl.$^3$ .................. C21D 1/09; C21D 1/74
[52] U.S. Cl. ................. 422/186.04; 266/250; 373/26
[58] Field of Search .......... 250/531; 148/16.6; 13/31 R; 118/715, 716, 625; 427/39; 204/177; 266/252, 255

[56] References Cited

U.S. PATENT DOCUMENTS

| 2,930,825 | 3/1960 | Johnson | 13/31 |
| 3,112,919 | 12/1963 | Gunow | 266/250 |
| 3,190,772 | 6/1965 | Berghaus | 148/16.6 |
| 3,302,939 | 2/1967 | Scharbrough | 266/256 |
| 3,327,041 | 6/1967 | Clune | 13/31 |
| 3,389,070 | 7/1968 | Berghaus | 250/531 |
| 3,565,410 | 2/1971 | Scherft | 266/250 |
| 3,594,302 | 7/1971 | Rordorf | 250/531 |
| 3,622,135 | 11/1971 | Bauer | 266/250 |
| 3,730,863 | 5/1973 | Keller | 148/16.6 |
| 4,179,618 | 12/1979 | Tanaka | 250/531 |

FOREIGN PATENT DOCUMENTS 1262897 2/1972 United Kingdom.

Primary Examiner—Brooks H. Hunt
Assistant Examiner—J. J. Zimmerman
Attorney, Agent, or Firm—Wenderoth, Lind & Ponack

[57] ABSTRACT

This invention relates to a retort type apparatus for ion-nitriding treatment which is so designed as to effect heating and nitriding of a workpiece at high thermal efficiency, with excellent uniformity and in a short time, by using both glow discharge and heat produced by a heating element.

8 Claims, 12 Drawing Figures

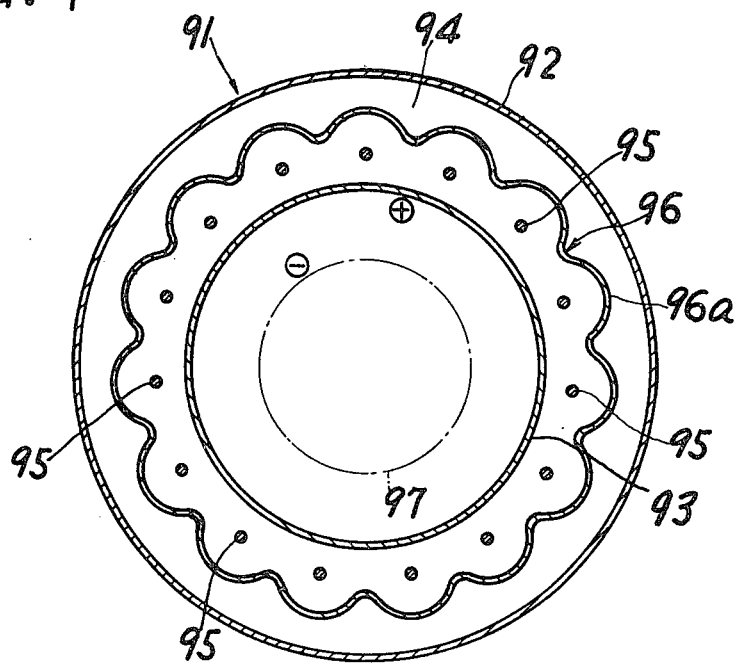
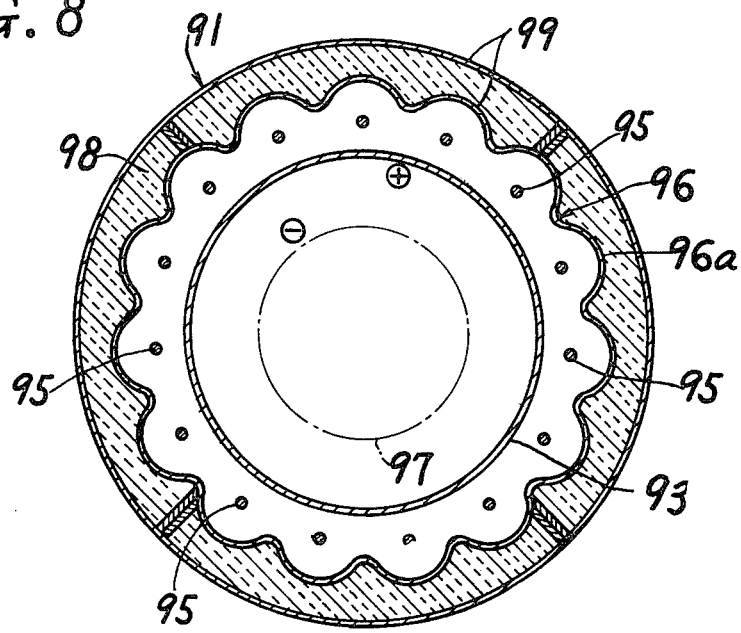

ION-NITRIDING APPARATUS

This is division of application Ser. No. 4613, filed Jan. 18, 1979 which is, in turn, a continuation of application Ser. No. 751,328, filed Dec. 16, 1976.

BACKGROUND OF THE INVENTION

This invention relates to an apparatus for ion-nitriding treatment, whereby nitrogen gas molecules are ionized by glow discharge and nitrogen ions thus produced are made to collide with a workpiece for nitriding treatment.

DESCRIPTION OF THE PRIOR ART

In the conventional apparatus of this kind, firstly glow discharge is produced by impressing DC voltage under vacuum (1–10 Torr, with a workpiece for treatment as cathode and the receptacle wall as anode in a metallic receptacle, secondly nitrogen gas molecules are ionized by glow discharge, thirdly the workpiece is heated while making the nitrogen ions produced collide with the workpiece, and lastly glow discharge nitriding is effected by glow discharge while keeping the workpiece at the required treating temperature by glow discharge. Accordingly, if the workpiece to be treated is cold at the initial stage of treatment, glow discharge is unstable and local arc discharge is apt to take place, depending upon the degree of vacuum, gas atmospheric condition, etc., with the result of uneven treatment, more time taken for heating and low efficiency at each cycle. Even after the required treating temperature (350° C.–570° C.) has been attained, if the workpiece to be treated is of special shape, such as a workpiece having a sharp pointed end or a narrow gap (6–10 mm in distance), glow discharge is concentrated upon such particular part and consequently the temperature of such particular part rises abnormally, making it impossible to effect uniform treatment. Also, if the distance between the anode and the workpiece to be treated is larger, glow discharge dies out at or about the central part of a vacuum reacting furnace. Therefore, it has been a general practice that the workpiece to be treated is not placed at the central part of the vacuum reacting furnace. This involves such disadvantages that the workpiece holding capacity of the vacuum reacting furnace is not large for its volume and it takes much time to carry out vacuum suction, with resultant increase in gas consumption. Moreover, in the conventional apparatus, if the workpiece to be treated is cold at the initial stage of treatment, abnormal arc discharge is apt to occur due to high glow discharge density (w/cm$^2$), with the result that heating is uneven, and even after the required treating temperature has been attained, uniform temperature cannot be obtained and naturally, uniform nitriding is unobtainable. In order to realize uniform temperature distribution and uniform nitriding treatment, therefore, it was necessary to make the vacuum reacting furnace smaller in furnace body diameter and larger in the furnace height. However, the furnace body of such shape had a disadvantage in that it is not applicable to the treatment of the workpiece of large disc shape, such as a gear wheel for use in large ships. Furthermore, in the conventional apparatus of this kind, in order to improve thermal and electric conductivity and to ensure cooling of the anode, the receptacle wall is of water-cooled double construction, by which the receptacle wall is cooled down to the adequate temperature by water cooling. This, however, involves such disadvantages as higher cost of the apparatus, poor workability and complexity of maintenance and inspection. Also, in the conventional apparatus, since the pre-heating and glow discharge treatment are carried out on continuous basis by a single power source device for glow discharge, it is impossible to work each furnace in overlap with a single power source device for glow discharge in the case where a plurality of vacuum reacting furnaces are worked abreast, and it is uneconomical to provide each furnace with a respective power source device for glow discharge because such power source device is very expensive.

SUMMARY OF THE INVENTION

An object of the present invention is to eliminate the above-mentioned defects of the conventional apparatus by providing an apparatus for ion-nitriding which can heat and nitride a workpiece uniformly with high thermal efficiency and in a short time, by using heat produced by a heating element in combination with glow discharge.

Another object of the present invention is to provide the apparatus for ion-nitriding which uses effectively the radiant heat emitted by the above-mentioned heating element and prevents heat loss for better thermal efficiency, by utilizing the upper and lower sides of the furnace body (other than the inner wall of the furnace body which acts as anode of the vacuum reacting furnace) as heat reflectors.

Still another object of the present invention is to provide the apparatus for ion-nitriding which exhibits black-body radiation for better thermal efficiency by blackening the surface of the inner wall of the furnace body which acts as anode of the vacuum reacting furnace.

A further object of the present invention is to provide the apparatus for ion-nitriding which, by using a clad plate or a plated plate having aluminum or nickel layer in the surface of iron plate as material of the inner wall of the furnace body which acts as anode of glow discharge, is improved in the thermal and electric conductivity and also in the radiative efficiency of the furnace wall acting as anode, and prevents overheating with resultant improvement and stabilization of anode efficiency and thus carries out heatng and nitriding of a workpiece uniformly by glow discharge with high thermal efficiency and in a short time.

A still further object of the present invention is to provide the apparatus for ion-nitriding which, by using an auxiliary anode at the central part of the furnace body in combination with the main anode of the inner wall of the furnace body, and by using heat emitted by a heating element in addition to glow discharge, is able to carry out uniformly heating and nitriding of a workpiece with high efficiency and in a short time, and to increase the workpiece holding capacity.

Another object of the present invention is to provide the apparatus for ion-nitriding which, by using an auxiliary anode at the central part of the furnace body in combination with the main anode of the inner wall of the furnace body, and also heat emitted by a heating element in addition to glow discharge, and by carrying out the heating by a heating element at the central part of the furnace as well as at the outer circumferential part of the furnace, is able to carry out heating and nitriding of a workpiece with more efficiency and uniformity in a short time.

Another object of the present invention is to provide the apparatus for ion-nitriding of a workpiece of large disc shape which is enabled to heat and nitride uniformly the workpiece of large disc shape, by using the heating by heating element, as heat-source for maintaining the nitriding treating temperature in addition to glow discharge, and by making the furnace body larger in diameter and smaller in height.

Still another object of the present invention is to provide the apparatus for ion-nitriding which is so designed as to cool down the furnace body to an adequate temperature, to control the temperature inside the furnace to the proper temperature (350°–570° C.) and to prevent overheating of a workpiece by air-cooling the outer wall of the furnace body of the vacuum reacting furnace.

A further object of the present invention is to provide the apparatus for ion-nitriding which is enabled to carry out heating and nitriding of a workpiece uniformly in a short time by using infrared ray heating instead of the above-mentioned heating by heating element, and by heating the workpiece by the infrared rays in addition to glow discharge.

A still further object of the present invention is to provide the apparatus for ion-nitriding which is enabled to carry out treatment of a workpiece uniformly and in a short time, and to work a plurality of vacuum reacting furnaces effectively and in overlap by only a single power source device for discharge treatment (however, a separate power source device for pre-heating purposes is necessary), by carrying out pre-heating of the workpiece up to the temperature at which glow discharge is going on steadily at each vacuum reacting furnace by means of heating by heating element separately from conventional glow discharge, by carrying out discharge treatment of the workpiece by glow discharge as usual, and by separating the power source for vacuum reacting furnace into a power source device for pre-heating applicable independently to each furnace and a single power source device for discharge treatment, in other words, to provide the apparatus for ion-nitriding which is enabled to carry out glow discharge treatment in one furnace upon completing the glow discharge treatment in another furnace, and thus to work a plurality of furnaces in overlap effectively and economically.

BRIEF DESCRIPTION OF THE DRAWINGS

The nature and advantages of the present invention will be understood more clearly from the following description made with reference to preferred embodiments and accompanying drawings, in which:

FIG. 1–FIG. 10 illustrate embodiments of the present invention, of which

FIG. 1 is a vertical section at the center of Embodiment No. 1;

FIG. 2 is a main part, on an enlarged scale, of FIG. 1;

FIG. 3 shows an outline of the overall construction of Embodiment No. 2;

FIG. 4 shows an outline of the overall construction of Embodiment No. 3;

FIG. 5 shows an outline of the overall construction of Embodiment No. 4;

FIG. 6 shows an outline of the overall construction of Embodiment No. 5;

FIG. 7 is a cross section of Embodiment No. 6;

FIG. 8 is a cross section of the modification of Embodiment No. 6;

FIG. 9 shows an outline of the overall construction of Embodiment No. 7;

FIG. 10 shows an outline of the overall construction of Embodiment No. 8;

DETAILED DESCRIPTION OF PREFERRED EMBODIMENT

Embodiment No. 1

Figure 1:
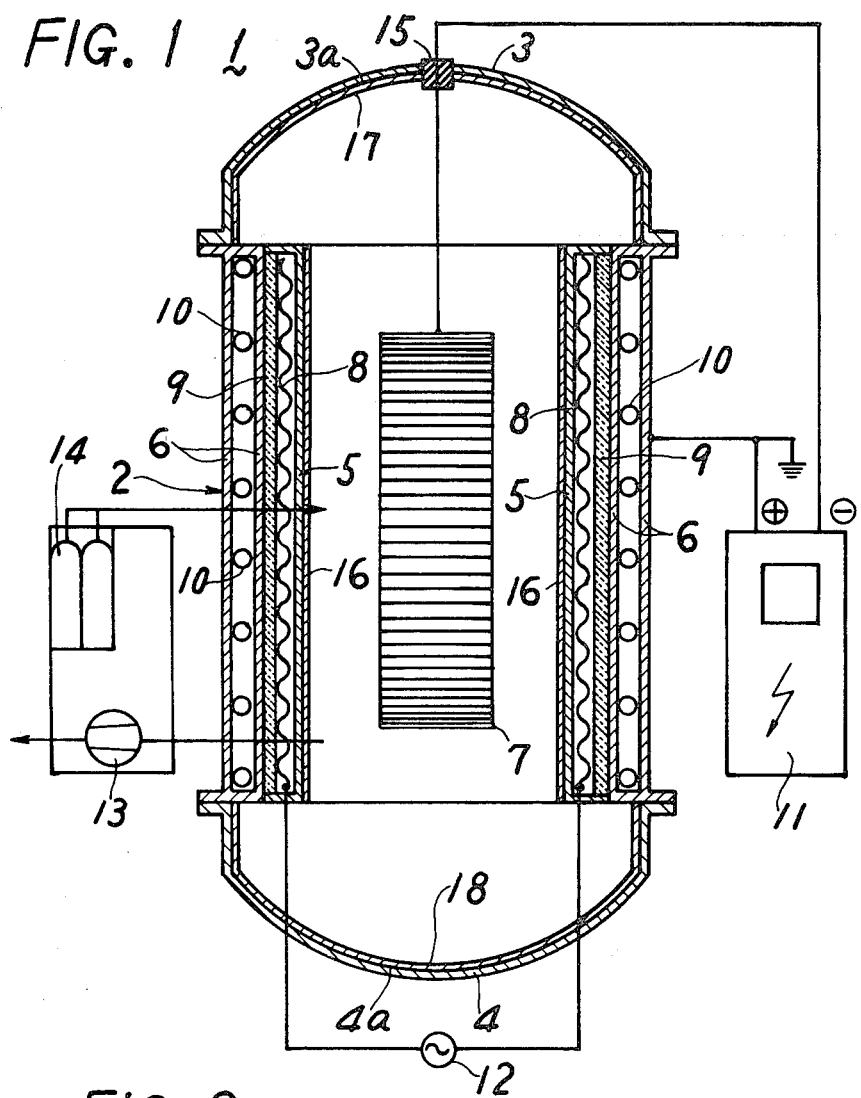

In FIG. 1, numeral 1 denotes a stainless steel vacuum reacting furnace comprising a cylindrical furnace body 2, a head covering body 3 and a bottom covering body 4 to cover the upper part and the bottom part, respectively, of said furnace body 2.

The afore-mentioned furnace body 2 is of double construction having an inner wall body 5 and an outer wall body 6 with a gap therebetween. Said inner wall body 5 acts as anode. DC voltage is impressed between the anode of the inner wall body 5 and a workpiece 7 to be treated, which is cathode, to produce glow discharge. An annular heating element 8 is disposed in the gap between the inner wall body 5 and the outer wall body 6. Provided between the outer circumference of said heating element 8 and the outer wall body 6 is an adiabatic material layer 9, such as graphite felt of high purity, ceramic fiber or the like, which prevents heat from being radiated to the outer circumference (on the side of the outer wall body 6). The afore-mentioned heating element 8 may be a tubular graphite cloth heating element or sheath heater, for example. The afore-mentioned outer wall body 6 is of double construction with water-cooling pipes 10 embedded therein to cool the outer wall body 6. Numeral 11 denotes a power source device for discharge to impress DC voltage between the inner wall body 5 and the workpiece 7. Numeral 12 denotes a power source device for heating to impress AC voltage upon the heating element 8. Numeral 13 denotes a vacuum pump to suction-exhaust the inside of the vacuum reacting furnace 1. Numeral 14 denotes a gas mixing and supplying apparatus, which supplies treating gas (mixed gas of $N_2$ and $H_2$, for example) and numeral 15 denotes an electric insulator.

A blackened film layer 16 is laid on the inner circumferential surface of the afore-mentioned inner wall body 5 (anode). This blackened film layer 16 is formed by blackening the inner surface of the inner wall body 5 by the chromic acid oxidizing method, the graphite powder coating method, etc.

The afore-mentioned head covering body 3 and the bottom covering body 4 are formed in a concave spherical surface at inner surfaces 3a and 4a respectively, which are covered with reflector surface layers 17, 18 coated with Cr, Au, Pt, Al, etc. Such reflector surface layers act as reflecting plates to reflect effectively radiant heat from the afore-mentioned heating element 8 to the inside of the furnace body 2, thereby preventing heat from being radiated outward.

Figure 2:
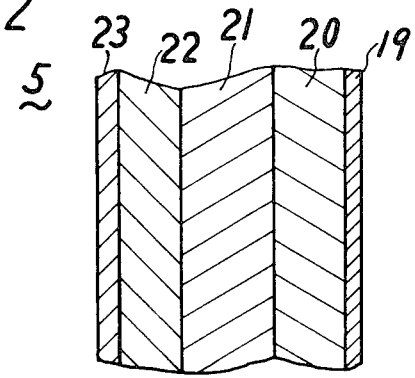

The afore-mentioned inner wall body 5, an example of which is shown by FIG. 2, is composed of a clad plate having a fivefold layer of Al/Fe/Cu/Fe/Ni, the thickness distribution ratio of which is, for example, 5% for the aluminum layer 19, 25% for the iron layer 20, 38% for the copper layer 21, 25% for the iron layer 22 and 7% for the nickel layer 23. Material of the inner wall body 5 is also available in a clad plate of Al/Fe/Al triple layer, Ni/Fe/Ni triple layer, Al/Fe/Cu triple layer, Ni/Fe/Al triple layer, and Al/Fe/Cu/Fe/Al fivefold layer. In some cases, the inner wall body 5 is composed of aluminium-plated iron plate or iron plate penetrated with aluminium.

In the case where the surface of the inner wall body 5 is an aluminium layer, the above-mentioned blackened layer 16 is obtained by heating the inner wall body 5 in the atmosphere at a temperature not exceeding 430° C. and then heating it further in a hydrogen gas atmosphere at a temperature of 700° C.–900° C., whereby a blackened film ($FeAl_3$) is formed on the surface. In the case where the surface of the inner wall body 5 is a nickel layer, the blackened film is formed by heating the surface in hydrocarbon (butane $C_4H_{10}$, for example) to soot the surface.

Referring now to the operation of the apparatus, glow discharge is generated by impressing DC voltage between the anode (the inner wall body 5 of the furnace body 2 of the vacuum reacting furnace 1) and the cathode (the workpiece 7 accommodated in the vacuum reacting furnace 1). Also, the heating element 8 generates heat if electric current is applied thereto. The workpiece 7 is heated uniformly and in a short time by combined use of such glow discharge and heat by the heating element 8, and after it is heated up to the suitable temperature (350° C.–570° C.) at which glow discharge nitriding is going on steadily, it is subjected to uniform nitriding by glow discharge while it is kept heated to said temperature by the heating element 8.

Since the heating element 8 is arranged in such a state that it is covered by the inner wall body 5, there is no fear that arc discharge or unusual glow discharge is generated between the heating element 8 and the workpiece 7.

The arrangement of the adiabatic material layer 9 at the outer circumference of the heating element 8 has such advantage that when the workpiece 7 is heated, radiation of heat outside the furnace body 2 can be prevented and thus heat emitted by the heating element 8 can be used effectively and solely for heating of the workpiece 7. Moreover, radiant heat emitted by the heating element 8 upwardly and downwardly in relation to the furnace body 2 is reflected to the inside of the furnace body 2 by means of reflector surface layers 17, 18 at the inner surface of the head covering body 3 and the bottom covering body 4 and thus radiant heat can be used effectively and solely for heating of the workpiece 7. Accordingly, heating of the workpiece 7 can be done uniformly in a short time.

The blackened film layer 16 arranged at the inner circumferential surface of the inner wall body 5 of the furnace body 2 makes it possible to carry out black body radiation, with the result that heat radiative efficiency is much improved and heating of the workpiece can be done in a shorter time with higher thermal efficiency.

The inner wall body 5, which is the anode, is composed of a simple substance of a triple layer of aluminium clad iron, a triple layer of nickel clad iron, a triple layer of aluminium and copper clad iron, a triple layer of nickel and aluminium clad iron, a fivefold layer of aluminium and iron clad copper or a fivefold layer of aluminium, nickel and iron clad copper, or, composed of sheet plate of such clad plate stuck to the inner circumferential surface of iron plate, or, composed of a simple substance of aluminium-plated iron plate or iron plate subjected to aluminium infiltration. Thus, the inner circumferential surface of the inner wall body 5 has an aluminium layer or a nickel layer and therefore thermal conductivity and electric conductivity are improved, with the result that overheating of the furnace wall (anode) is prevented, anode efficiency is improved and stabilized, and heating and nitriding of the workpiece by glow discharge can be done uniformly and in a short time.

Embodiment No. 2

Figure 3:
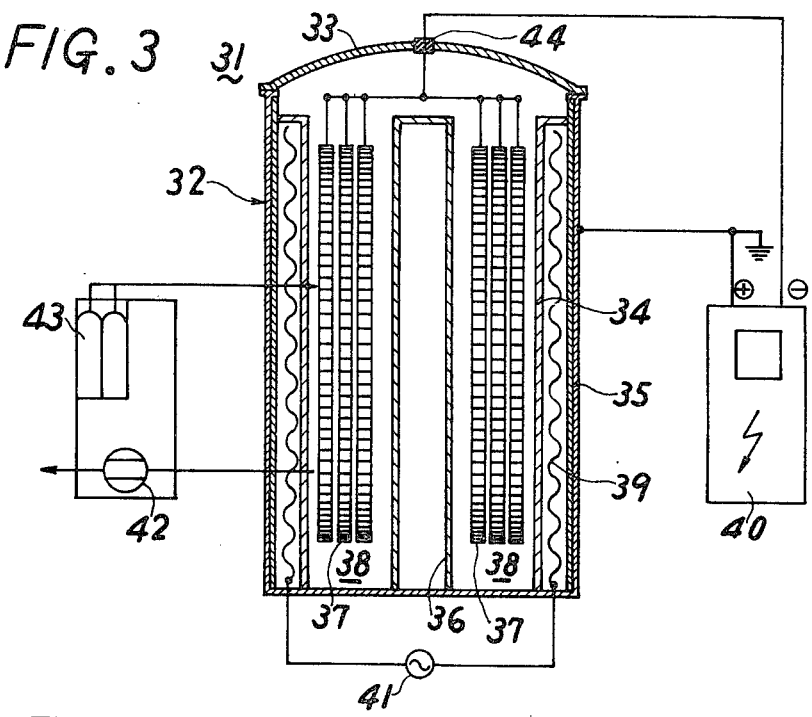

As shown in FIG. 3, this embodiment includes an auxiliary anode for glow discharge disposed independently at the center of the vacuum reacting furnace. Numeral 31 denotes a stainless steel vacuum reacting furnace which comprises a cylindrical furnace body 32 and a lid 33 to cover the upper opening of said furnace body 32. The furnace body 32 is of double construction having an inner wall body 34 and an outer wall body 35 with a gap therebetween. The inner wall body 34 is the main anode and a pillar-shaped auxiliary anode body 36 is a workpiece. A workpiece 37 is placed in the space 38 formed in the furnace between anode bodies 34 and 36. DC voltage is impressed between the workpiece 37, which is cathode, and the anode bodies 34, 36 so as to generate glow discharge. An annular heating element 39 is disposed in the gap between the afore-mentioned inner wall body 34 and the outer wall body 35. The outer wall body 35 is of double construction and also of water-cooling construction for cooling the outer wall body 35 to the proper temperature. Numeral 40 is a power source device for discharge to impress DC voltage between main and auxiliary anode bodies 34, 36 and the workpiece 37 (cathode). Numeral 41 is a power source device for heating to be used for the heating element 39. Numeral 42 denotes a vacuum pump. Numeral 43 denotes a gas mixing and supplying apparatus. Numeral 44 denotes an insulator.

Referring to the operation of the apparatus, glow discharge is generated when DC voltage is impressed between the anodes (the inner wall body 34 of the furnace body 32 of the vacuum reacting furnace 31 and the auxiliary anode body 36 at the center of the furnace body 32) and the cathode (the workpiece 37 placed in the space 38 in the furnace). The heating element 39 generates heat when electric current is applied thereto. The workpiece 37 is heated up to the suitable temperature at which glow discharge nitriding is going on steadily by the combined use of the glow discharge and heat generated by the heating element 39, and such heating of the workpiece can be done uniformly in a short time. After the workpiece is heated up to the suitable temperature at which glow discharge nitriding is going on steadily, it is subjected to uniform nitriding by glow discharge while it is kept heated to said temperature by the heating element 39. Because of the auxiliary anode body 36 provided at the center of the furnace body 32, ions proceed from the main anode (inner wall body 34 of the furnace body 32) toward the center of the furnace, and also from the auxiliary anode 36 toward the outer circumference. Therefore, glow discharge is generated stably throughout the whole area of the space 38 in the furnace and thus it is possible to effect ion-nitriding about the center in the furnace 31 and to increase workpiece holding capacity. Moreover, existence of the auxiliary anode body 36 in the furnace 31 decreases the inside volume of the furnace, with the result of shortening of vacuum suctioning time and saving of gas consumption.

Embodiment No. 3

Figure 4:
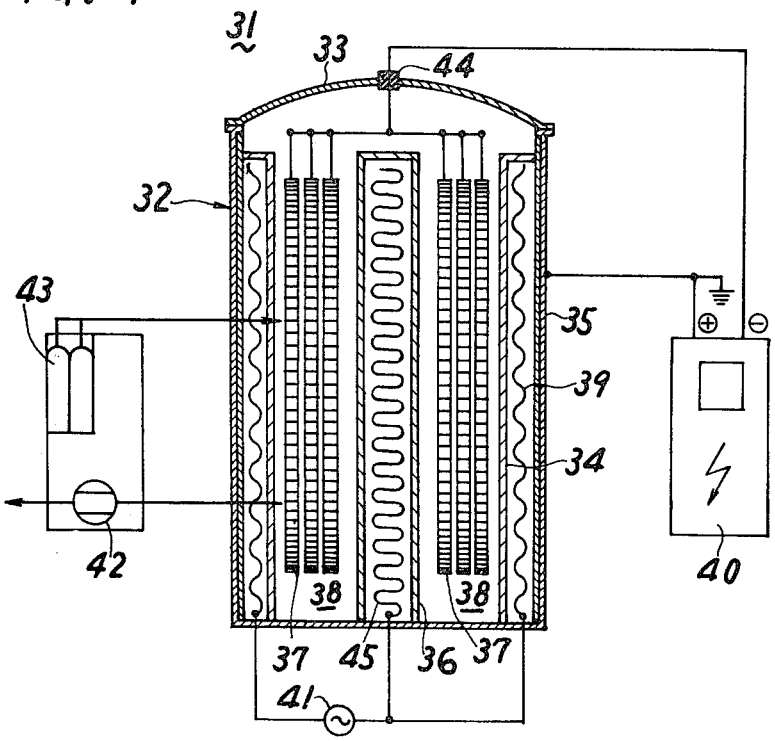

This embodiment is the same as Embodiment No. 2 in construction, with the exception that as shown in FIG. 4, this embodiment includes a central heating element 45 disposed in the auxiliary anode body 36 (in Embodiment No. 2), which generates heat by impressing AC voltage from a power source device for heating 41 for the use of heating element 39.

In the case of this embodiment, arrangement of an outer circumference heating element 39 at the outer circumferential part of the furnace 31, a central heating element 45 at the center of the furnace 31 and the auxiliary anode body 36 at the center of the furnace body 32 improves heating efficiency (heating up to the suitable temperature at which glow discharge nitriding is going on steadily and maintaining said temperature) to a large extent. Moreover, since heating is given from both the outer circumference and the center of the furnace 31, the space 38 in the furnace into which the workpiece 37 is inserted is heated still more uniformly and glow discharge is stabilized throughout the whole area of the space 38 in which the workpiece 37 is placed. Accordingly, it is possible to increase the workpiece holding capacity still further.

Embodiment No. 4

Figure 5:
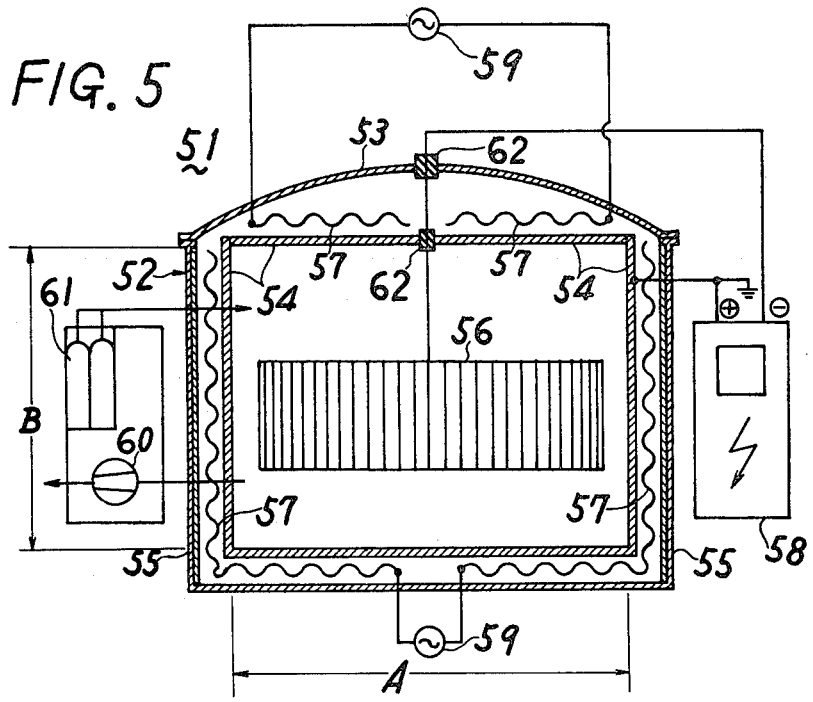

In FIG. 5, numeral 51 is a stainless steel vacuum reacting furnace comprising a cylindrical furnace body 52 and a lid 53 to cover the upper opening of said furnace body 52. The furnace body 52 is of double construction having an inner wall body 54 and an outer wall body 55 with a gap therebetween. Said inner wall body 54 acts as anode. Numeral 56 is a workpiece of large disc shape, such as a gear wheel for use in large ships, which acts as cathode. DC voltage is impressed between the afore-mentioned inner wall body 54 (anode) and the workpiece 56 (cathode) to generate glow discharge. Disposed in the gap between the inner wall body 54 and the outer wall body 55 is an annular heating element 57. The afore-mentioned outer wall body 55 is of double construction and also of water-cooling construction to cool the outer wall body 55 to the proper temperature.

As to the shape of the above-mentioned furnace body 52, the furnace body diameter (A) which is the diameter of an effective area in the furnace (namely, inside diameter of the furnace body 52) is larger than the height (B) which is the height of the effective area in the furnace body 52, that is, the furnace body 52 is so formed that the ratio of furnace body diameter (A) to the furnace body height (B) (A/B) is more than 1. Numeral 58 is a power source device for discharge to impress DC voltage between the inner wall body 54 and the workpiece 56. Numeral 59 is a power source device for heating for the use of the heating element 57. Numeral 60 is a vacuum pump. Numeral 61 is a gas mixing and supplying apparatus. Numeral 62 is an insulator.

Referring to the operation of the apparatus, in the case where ion-nitriding treatment is given to the workpiece 56 of large disc shape, such as a gear wheel for use in large ships, the workpiece 56 can be inserted into the furnace as it is held in horizontal position because the furnace body 52 of the vacuum reacting furnace 51 is so formed that the ratio (A/B) (the ratio of furnace body diameter (A) to the furnace body height (E)) is more than 1. When DC voltage is impressed between the workpiece 56 of large disc shape as cathode and the inner wall body 54 of the furnace body 32 as anode, glow discharge is generated. The heating element 57 emits heat when electric current is applied thereto. By the combined use of the glow discharge and heat emitted by the heating element 57, the workpiece 56 of large disc shape is heated up to the suitable temperature at which glow discharge nitriding is going on steadily. After this temperature has been attained, uniform nitriding treatment can be carried out by glow discharge, while keeping the workpiece 56 to the temperature suitable for nitriding treatment. Even if, in this case, the furnace body height B of the furnace body 52 is small and the furnace body diameter A is large, heating of the workpiece 56 and maintenance of the nitriding temperature (350° C.–570° C.) can be done uniformly in a short time. Thus, good nitriding treatment of the workpiece 56 of large disc shape is possible.

Embodiment No. 5

Figure 6:
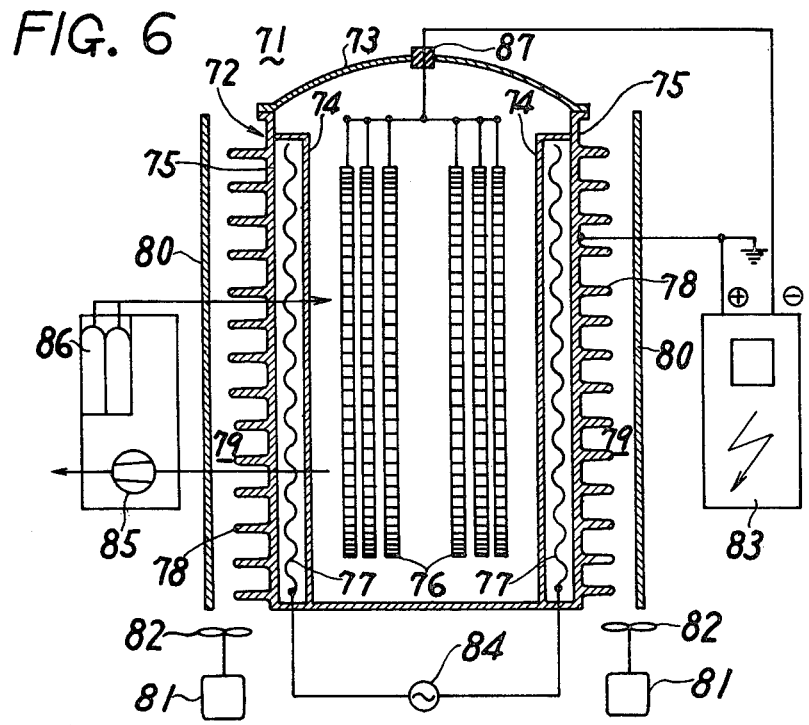

In FIG. 6, numeral 71 denotes a stainless steel vacuum reacting furnace comprising a cylindrical furnace body 72 and a lid 73 to cover the upper opening of said furnace body 72. The furnace body 72 is of double construction having an inner wall body 74 and an outer wall body 75 with a gap therebetween. Glow discharge is generated by impressing DC voltage between the inner wall body 74 as anode and a workpiece 76 inserted in the vacuum reacting furnace 71 as cathode. An annular heating element 77 is disposed in the gap between the inner wall body 74 and the outer wall body 75. Air-cooled fins 78 are provided protrudingly at the outer circumference of the outer wall body 75. A tubular screening wall 80 is disposed at the outer circumference of said fins 78 with a given gap 79 between the two. A plurality of air-cooling fans 82 operated by respective motors 81 are disposed below (or above) the outer wall body 75. Numeral 83 is a power source device for discharge to impress DC voltage between the inner wall body 74 and the workpiece 76. Numeral 84 is a power source device for heating to be used for applying electric current to the heating element 77. Numeral 85 is a vacuum pump. Numeral 86 is a gas mixing and supplying apparatus. Numeral 87 is an insulator.

In the case of this embodiment, since the furnace body 72 of the vacuum reacting furnace 71 is of double construction having the inner wall body 74 and the outer wall body 75, the inner wall body 74 can be used as anode for glow discharge (or also acts to screen the heating element 77) and therefore the outer wall body 75 can be used as a structural member for cooling the temperature in the furnace to the proper degree, namely, by providing air-cooled fins 78 protruding at the outer wall body 75. By cooling said air-cooled fins 78 by the air-cooling fan 82 to the proper temperature, thermal conductivity and electric conductivity of the inner wall body 74 of the vacuum reacting furnace 71 can be maintained in good condition and heat radiation is improved. Thus, heating and nitriding of the workpiece 76 can be done uniformly and effectively.

Embodiment No. 6

As shown by FIG. 7 or FIG. 8, this embodiment employs the infrared heating, instead of heating by the heating element 8 in Embodiment No. 1.

In FIG. 7, numeral 91 is a cylindrical vacuum reacting furnace of double construction having an outer furnace wall 92 and an inner furnace wall 93 which acts as anode. A plurality of infrared heaters 95 are disposed circularly in an annular space 94 between the outer wall 92 and the inner wall 93 in upright position. A reflector 96a with a series of small concaves 96 is provided at the outer circumference of said infrared heaters 95, 95 . . . for reflecting uniformly the infrared rays from each infrared heater 95. Numeral 97 is a workpiece as cathode.

Referring to the operation of this apparatus, glow discharge is generated by impresssing DC voltage between the inner wall 93 (anode) of the furnace 91 and the workpiece 97 (cathode). The infrared heater 95, when AC current is applied thereto, radiates infrared rays. These infrared rays are radiated uniformly in the direction of the center of the furnace 91 by means of the reflector 96. By the combined use of this glow discharge and infrared heating, the workpiece 97 is heated up to the suitable temperature at which glow discharge nitriding is going on steadily, in a short time and with uniformity. Then, the workpiece 97 is subjected to glow discharge nitriding while it is kept heated to the suitable temperature at which glow discharge nitriding is going on steadily. Thus, the workpiece 97 is nitrided uniformly.

In the above embodiment, the furnace wall is of double construction, permitting use of the inner wall 93 as anode for glow discharge, and the infrared heater 95 is provided separately from this anode for glow discharge. However, the function of the anode for glow discharge can be combined with the infrared heater 95, namely, glow discharge can be obtained in the following way. The infrared radiation is effected by charging AC current on the infrared heater 95 and glow discharge is generated by impressing DC voltage between the infrared heater 95 and the workpiece 97. In this case, the inner wall 93 is unnecessary and therefore the vacuum reacting furnace 91 need have only the outer wall 92.

Also, as shown in FIG. 8, it is possible to improve the thermal efficiency of the cylindrical vacuum reacting furnace 91 and to shorten the treating time required for each cycle by forming an outer wall 99 of integral construction in which the outer wall 92 and the reflector 96 are integrated, and by filling the annular space of said outer wall 99 of integral construction with an insulator 98.

Embodiment No. 7

Figure 9:
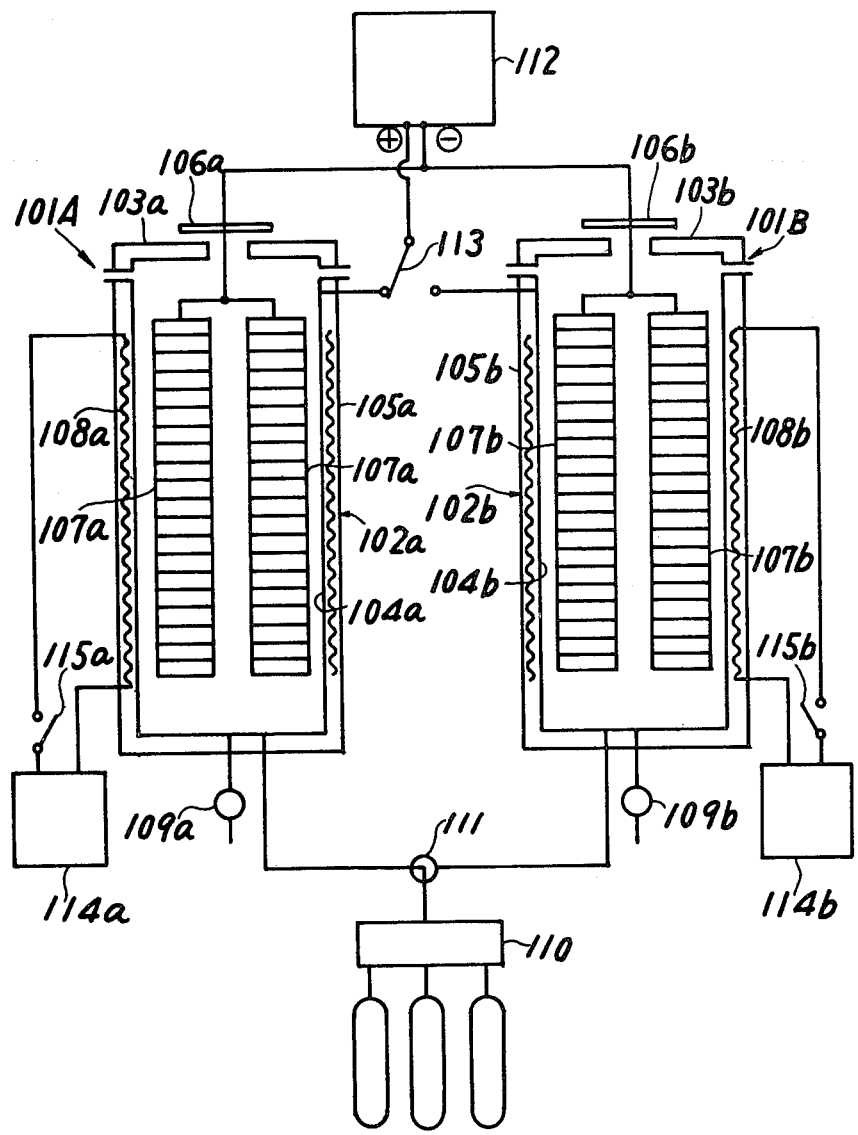

In FIG. 9, 101A and 101B each denote a vacuum reacting furnace, each comprising a furnace body 102a, 102b and a canopy 103a, 103b. The furnace body 102a (or 102b) is of double construction having an inner wall 104a (or 104b) and an outer wall 105a (or 105b). Glow discharge is generated by impressing DC voltage between said inner wall 104a, 104b as anode and a workpiece 107a, 107b (connectedly supported by a cathode 106a, 106b carried by the canopy 103a, 103b as cathode. An electric heater 108a, 108b is disposed in the gap between the inner wall 104a, 104b and the outer wall 105a, 105b. Numerals 109a and 109b are vacuum pumps. Numeral 110 is a gas mixing and supplying apparatus. Numeral 111 is a switch valve.

Numeral 112 denotes a power source device for discharge, whereby glow discharge is generated by impressing DC voltage between the inner wall 104a, 104b of the furnace body of the vacuum reacting furnace 101A, 101B and the workpiece 107a, 107b. It is switchably connected to the vacuum reacting furnace 101A, 101B through a changeover switch 113. Each of 114a and 114b is a power source device for heating connected to heater 108a, 108b of the vacuum reacting furnace 101A, 101B through switch 115a, 115b.

Referring to the operation of this apparatus, in the case where working is started from the vacuum reacting furnace 101A, firstly the workpiece 107a is inserted in the furnace 101A, secondly the furnace 101A is made vacuous by means of the vacuum pump 109a, thirdly the workpiece 107a is heated up to the temperature at which glow discharge treatment is possible by closing switch 115a and by applying AC current from the power source device 114a to the electric heater 108a. When the workpiece 107a has reached the temperature at which glow discharge treatment is possible, treating gas is supplied from the gas mixing and supplying apparatus 110 into the furnace 101A via the switch valve 111 and the discharge treatment by glow discharge is started by impressing DC voltage between the inner wall 104a of the furnace body and the workpiece 107a after the changeover switch 113 of the power source device for discharge treating is positioned on the furnace 101A side. During the glow discharge treatment, heating by the electric heater 108a is continued to keep the workpiece 107a heated at the temperature suitable for discharge treatment. By this time, insertion of the workpiece 107b in the other vacuum reacting furnace 101B and vacuum suctioning by means of the vacuum pump 109b have been finished. By starting the pre-heating of the furnace 101B by means of the electric heater 108b through closing the switch 115b at the same time as or after the start of glow discharge treatment on the furnace 101A side, glow discharge treatment at the furnace 101A and pre-heating at the furnace 101B can be done in parallel. Upon completion of the glow discharge treatment at the furnace 101A, preheating at the furnace 101B is completed. Then, at the same time as the glow discharge treatment at the furnace 101B is started by switching the changeover switch 113 over to the side of the treating furnace 101B, heating by the electric heater for heating 108a is stopped by opening the switch 115 of the power source device 114a on the side of the furnace 101A. While the glow discharge treatment at the furnace 101B is in progress, the workpiece 107a in the furnace 101A for which glow discharge treatment has already been finished is cooled and taken out to be shifted to the succeeding cycle. Thus, each process of "inserting of the workpiece"—"vacuum suctioning"—"pre-heating"—"glow discharge treatment"—"cooling"—"removing the treated workpiece" in each furnace 101A and 101B can be carried out continuously, overlapping each other, by switching operation of the changeover switch 113, the switch 115a, 115b and the switch valve 111, as represented by the process cycle shown by FIG. 11.

Figure 11:
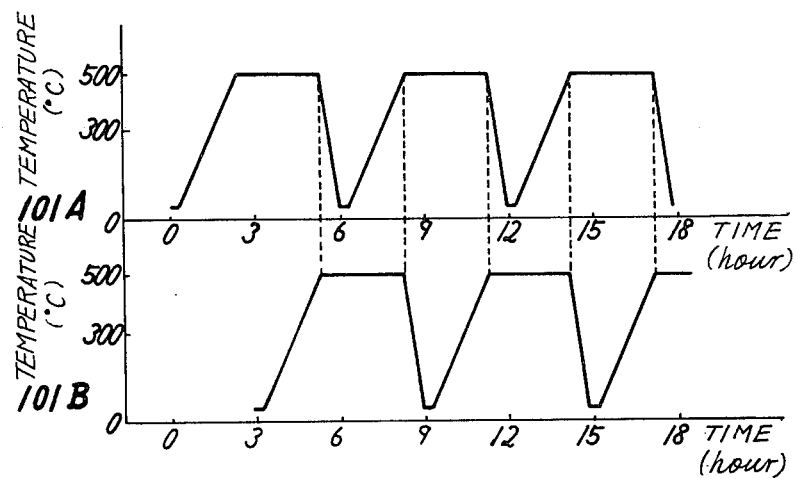
FIG. 11 shows a treating cycle in the case of Embodiment No. 7 (or Embodiment No. 8)
Figure 12:
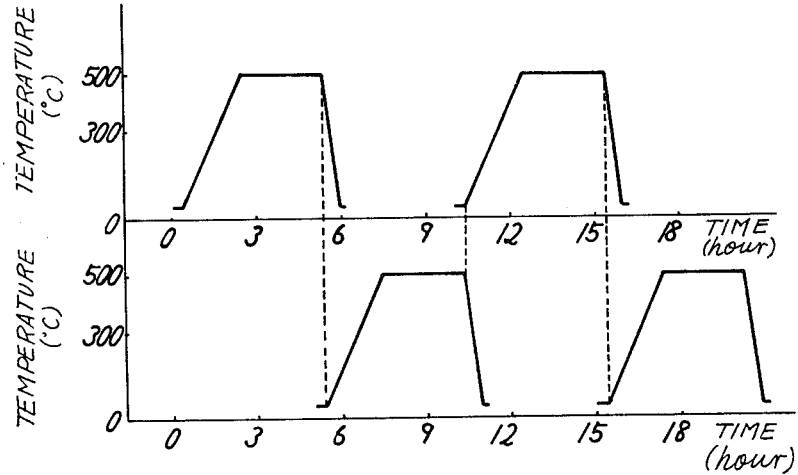
FIG. 12 shows a treating cycle in the case of a conventional example.

As indicated by FIG. 11, glow discharge treatment in two vacuum reacting furnaces 101A, 101B is carried out continuously and the power source device for discharge 112 is in such state that it is working continuously by the switching operation. On the other hand, in the conventional two-furnace one-power source system, in the case where the maximum working efficiency has been attained by working the power source continuously as indicated by FIG. 12, pre-heating and glow discharge treatment in each furnace are a continuous process cycle. Therefore, according to the present invention the cycle for two furnaces can be shortened by the time which corresponds to the pre-heating time in one of the two furnaces.

Embodiment No. 8

Figure 10:
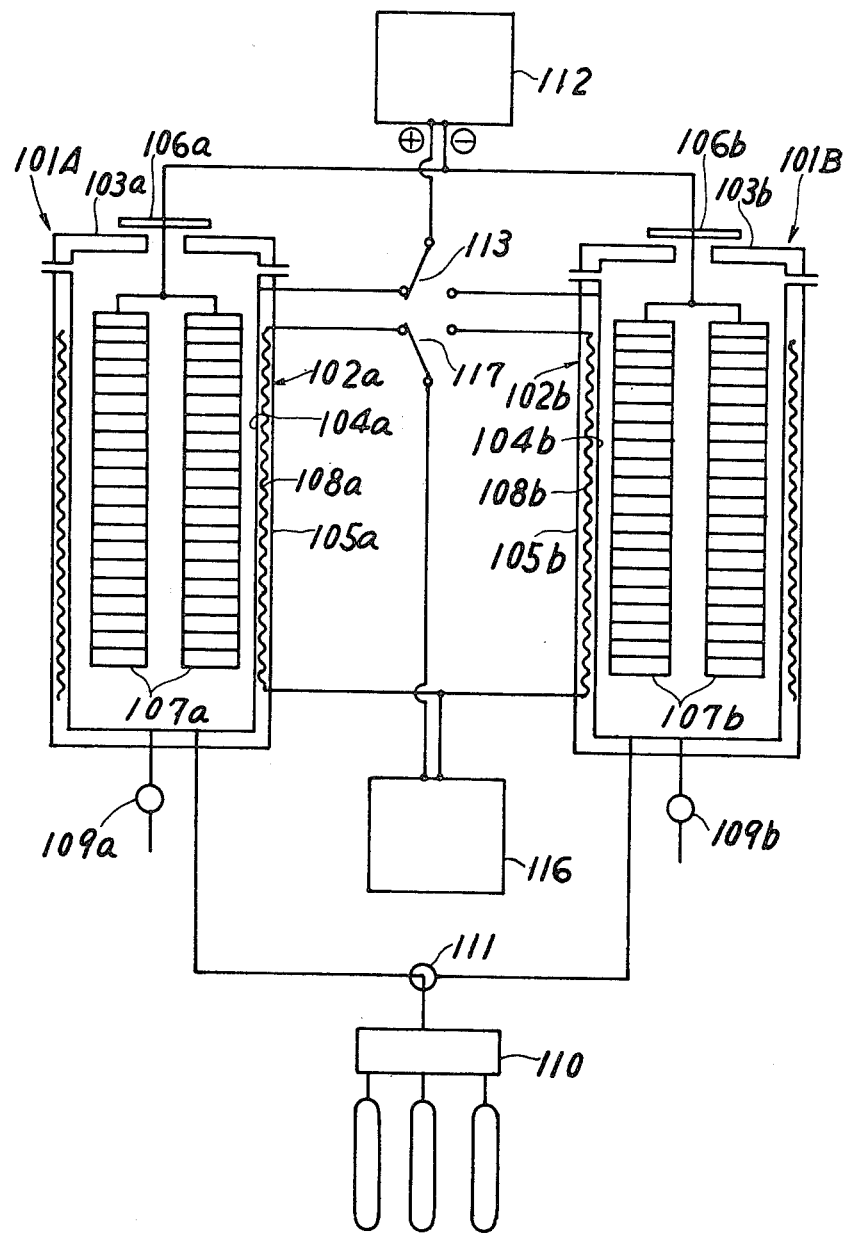

In Embodiment No. 7 each of the vacuum reacting furnaces 101A and 101B is provided with an individual power source device for heating 114a and 114b respectively but in this embodiment, as shown in FIG. 10, only one power source device for heating 116 is provided for both vacuum reacting furnaces 101A and 101B. This power source device 116 is connected switchably to the electric heaters 108a, 108of the furnaces 101A and 101B respectively through a changeover switch 117. In this embodiment, since the power source device 116 is common to both electric heaters 108a, 108b, the workpieces 107a, 107b cannot be maintained at the suitable treating temperature by means of the electric heaters 108a, 108b. However, this embodiment is otherwise the same as Embodiment No. 7 in construction and operation.

According to the present invention, heating of a workpiece can be done uniformly in a short time, free from generation of local arc discharge, by carrying out ion-nitriding of the workpiece by the combined use of glow discharge and heating by the heating element. Accordingly, this invention provides the uniform ion-nitriding treatment in a short time, with resultant improvement of the efficiency at each cycle. In addition, the following advantages are obtainable from the present invention.

By making the furnace body double construction having an inner wall body and an outer wall body and by disposing a heating element between the inner wall body and the outer wall body, the inner wall body also acts as a screen for the heating element, as well as the anode for glow discharge. Therefore, generation of arc discharge or unusual glow discharge between the heating element and the workpiece to be treated can be prevented and thus heating by the heating element can be displayed effectively and heating efficiency can be improved.

Radiant heat can be utilized effectively by means of reflectors provided at the upper and the lower sides of the furnace body, with resultant improvement of thermal efficiency.

By using iron as material for the inner wall body of the furnace body and also using a clad plate or a plated plate having aluminium or nickel layer at its inner circumferential surface, thermal conductivity and electric conductivity of the inner wall body, which acts as anode during glow discharge, are improved, overheating of the inner wall body (anode) can be prevented and the anode efficiency can be improved and stabilized. Therefore, generation of local arc discharge can be prevented and uniform ion-nitriding can be done effectively and in a short time.

A blackened layer can be laid on the inner circumferential surface of the inner wall body, with resultant improvement of thermal radiative efficiency and shortening of treating time.

By carrying out ion-nitriding of a workpiece by the combined use of glow discharge and heating by the heating element, heating of the workpiece to be treated can be done uniformly and in a short time, with resultant improvement of efficiency of each cycle. Moreover, by providing both the main anode and the auxiliary anode, glow discharge can be generated stably, extending over the whole area, with resultant increase in the workpiece holding capacity, shortening of vacuum suctioning time and saving of gas consumption. By providing heating elements at the outer circumferential part and at the central part of the furnace and also by providing the main anode and the auxiliary anode, heating of the workpiece can be done still more efficiently and glow discharge can be generated still more stably, extending over the whole area of the furnace.

By constructing the furnace body of the vacuum reacting furnace in such a manner that the ratio of furnace body diameter to furnace body height is more than 1 and by carrying out the ion-nitriding of a workpiece by the combined use of glow discharge and heating by the heating element, heating of the workpiece of large disc shape such as gear wheels for use in large ships can be done uniformly, free from generation of local arc discharge. Thus, ion-nitriding of the workpiece of large disc shape can be carried out uniformly.

By the air-cooling construction provided by the combination of air-cooled fins provided protrudingly at the outer circumference of the furnace body wall of the vacuum reacting furnace and the air-cooling fan, the furnace body wall which acts as anode of the vacuum reacting furnace can be cooled to and maintained at the proper temperature, with resultant improvement of thermal radiation. Thus, heating of a workpiece can be done uniformly and effectively and efficiency at each cycle can be improved to a large extent.

By heating a workpiece in the vacuum reacting furnace by both glow discharge and the infrared heating by means of reflectors which reflect uniformly thermic rays of the infrared heater, heating of a workpiece can be done uniformly in a short time. Thus, uniform nitriding can be carried out and thermal efficiency can be improved to a large extent.

In the case where ion-nitriding is carried out by using a plurality of vacuum reacting furnaces, the power source for them is divided into a power source device for heating and a power source device for discharge. Under this arrangement, as discharge treating process at each furnace can be worked abreast on continuous basis, the working ratio of equipment can be improved considerably and also the cost of equipment and running cost can be reduced.

What is claimed is:

1. An ion-nitriding apparatus comprising:
   (a) a vacuum reacting furnace having a furnace body of double walled construction, with an outer wall body and an inner wall body, and a lid for inserting and removing a workpiece for treatment;
   (b) a heating element which generates heat electrically and is disposed between said outer wall body and said inner wall body in said vacuum reacting furnace, said heating element being electrically screened from said workpiece by said inner wall body;
   (c) glow discharge means to generate glow discharge between said inner wall body as anode and said workpiece inserted in said vacuum reacting furnace as cathode, the anode side of said glow discharge means being grounded;
   (d) a power source device having a positive terminal and a negative terminal for discharge to flow a direct current through said glow discharge means, said positive terminal connected to said anode of said discharge means and said negative terminal connected to said cathode of said discharge means; and (e) a power source device for heating to impress a voltage upon said heating element;

wherein the inner circumferential surface of the inner wall body of the furnace body is blackened.

2. An ion-nitriding apparatus comprising:
(a) a vacuum reacting furnace having a furnace body of double walled construction, with an outer wall body and an inner wall body, and a lid for inserting and removing a workpiece for treatment;
(b) a heating element which generates heat electrically and is disposed between said outer wall body and said inner wall body in said vacuum reacting furnace, said heating element being electrically screened from said workpiece by said inner wall body;
(c) glow discharge means to generate glow discharge between said inner wall body as anode and said workpiece inserted in said vacuum reacting furnace as cathode, the anode side of said glow discharge means being grounded;
(d) a power source device having a positive terminal and a negative terminal for discharge to flow a direct current through said glow discharge means, said positive terminal connected to said anode of said discharge means and said negative terminal connected to said cathode of said discharge means; and
(e) a power source device for heating to impress a voltage upon said heating element;

wherein the inner wall body of the furnace body is made of clad plate or plated plate with iron as core material, and an aluminum or nickel layer forming the inner surface of said inner wall body.

3. An ion-nitriding apparatus as recited in claim 2 or 1, further comprising:
reflectors provided on the upper and lower sides of the furnace body.

4. An ion-nitriding apparatus as recited in claims 3 or 2 further comprising:
(f) air-cooled fins for cooling said outer walls during said glow discharge provided protrudingly at the outer circumference of the outer wall body of the furnace body; and
(g) air-cooling to cool said fins.

5. An ion-nitriding apparatus as recited in claim 1 or 2 wherein the furnace body is shaped such that the ratio of furnace body diameter to furnace body height is more than 1.

6. An ion-nitriding apparatus as recited in claims 1 or 2, further comprising a tubular auxiliary anode, electrically connected to said inner wall body and arranged substantially in the center of the volume bounded by said inner wall body.

7. An ion-nitriding apparatus as recited in claim 6, further comprising and additional heating element arranged within said tubulary auxiliary anode for generating heat electrically.

8. An ion-nitriding apparatus comprising:
(a) a vacuum reacting furnace having a furnace body of double walled construction, with an outer wall body and an inner wall body, and a lid for inserting and removing a workpiece for treatment;
(b) an infrared ray heater which generates heat electrically and is disposed between said outer wall body and said inner wall body in said vacuum reacting furnace, said infrared ray heater being electrically screened from said workpiece by said inner wall body;
(c) a reflector disposed at the outer circumferential side of said infrared ray heater;
(d) glow discharge means to generate glow discharge between said inner wall body as anode and said workpiece inserted in said vacuum reacting furnace as cathode, the anode side of said glow discharge means being grounded;
(e) a power source device having a positive terminal and a negative terminal for discharge to flow a direct current through said glow discharge means, said positive and negative terminal respectively connected to said anode and cathode of said discharge means; and
(f) a power source device for heating to impress a voltage upon said infrared ray heater.

* * * * *

UNITED STATES PATENT AND TRADEMARK OFFICE
CERTIFICATE OF CORRECTION

PATENT NO. : 4,342,918

DATED : August 3, 1982

INVENTOR(S) : Akio Tanaka, et al

It is certified that error appears in the above-identified patent and that said Letters Patent is hereby corrected as shown below:

The term of this patent subsequent to February 1, 2000, has been disclaimed.

Signed and Sealed this

*Twenty-second* Day of *February 1983*

[SEAL]

*Attest:*

GERALD J. MOSSINGHOFF

*Attesting Officer*     *Commissioner of Patents and Trademarks*